(12) United States Patent
Fink

(10) Patent No.: US 9,793,578 B2
(45) Date of Patent: Oct. 17, 2017

(54) BATTERY MANAGEMENT SYSTEM HAVING AN INCREASED ROBUSTNESS AGAINST NEGATIVE VOLTAGES

(71) Applicants: Robert Bosch GmbH, Stuttgart (DE); Samsung SDI Co., Ltd., Yongin-si, Gyeonggi-do (KR)

(72) Inventor: Holger Fink, Stuttgart (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 297 days.

(21) Appl. No.: 14/410,167

(22) PCT Filed: Jun. 17, 2013

(86) PCT No.: PCT/EP2013/062477
§ 371 (c)(1),
(2) Date: Dec. 22, 2014

(87) PCT Pub. No.: WO2013/189870
PCT Pub. Date: Dec. 27, 2013

(65) Prior Publication Data
US 2015/0340743 A1    Nov. 26, 2015

(30) Foreign Application Priority Data
Jun. 22, 2012 (DE) .................. 10 2012 210 616

(51) Int. Cl.
*H01M 2/00* (2006.01)
*H01M 10/48* (2006.01)
(Continued)

(52) U.S. Cl.
CPC ....... *H01M 10/4257* (2013.01); *B60L 3/0046* (2013.01); *B60L 3/04* (2013.01);
(Continued)

(58) Field of Classification Search
CPC .......... H01M 2010/4278; H01M 2/34; H01M 6/5034; H01M 2010/4271; H01M 2/26; H01M 6/5044
See application file for complete search history.

(56) References Cited

U.S. PATENT DOCUMENTS 5,929,600 A * 7/1999 Hasegawa ............. H01M 2/105
320/112
7,433,794 B1 10/2008 Berdichevsky et al.
(Continued)

FOREIGN PATENT DOCUMENTS

DE    10 2011 079 120 A1    1/2013
DE    10 2011 082 937 A1    3/2013
(Continued)

OTHER PUBLICATIONS

International Search Report corresponding to PCT Application No. PCT/EP2013/062477, mailed Oct. 7, 2013 (German and English language document) (7 pages).

*Primary Examiner* — Patrick Ryan
*Assistant Examiner* — Julian Anthony
(74) *Attorney, Agent, or Firm* — Maginot, Moore & Beck LLP

(57) ABSTRACT

A battery management system includes at least one cell monitoring unit with a plurality of cell voltage terminals, supply lines coupled to the cell voltage terminals, and a cell monitoring circuit made of a plurality of electronic semiconductor modules connected in parallel via the supply lines. The battery management system is configured to monitor a plurality of battery cells via the cell monitoring unit. The battery cells are in each case connected on both sides with their respective positive battery cell terminal and negative battery cell terminal to the battery management system via the cell voltage terminals. Furthermore, one or several supply lines are provided with a melt fuse so that in
(Continued)

each battery cell that is connected to the battery management system at least one supply line coupled to the battery cell comprises a melt fuse in its current path.

10 Claims, 7 Drawing Sheets

(51) Int. Cl.
*H01M 10/42* (2006.01)
*H02J 7/00* (2006.01)
*G01R 31/36* (2006.01)
*H01M 2/34* (2006.01)
*B60L 11/18* (2006.01)
*B60L 3/00* (2006.01)
*B60L 3/04* (2006.01)
*H01M 2/20* (2006.01)

(52) U.S. Cl.
CPC ....... *B60L 11/1805* (2013.01); *B60L 11/1851* (2013.01); *B60L 11/1866* (2013.01); *B60L 11/1872* (2013.01); *G01R 31/362* (2013.01); *G01R 31/3658* (2013.01); *H01M 2/206* (2013.01); *H01M 2/34* (2013.01); *H01M 10/482* (2013.01); *H02J 7/007* (2013.01); *H02J 7/0021* (2013.01); *H02J 7/0026* (2013.01); *H02J 7/0029* (2013.01); *B60L 2240/547* (2013.01); *B60L 2240/549* (2013.01); *B60L 2250/10* (2013.01); *B60L 2270/20* (2013.01); *H01M 2010/4271* (2013.01); *H01M 2200/00* (2013.01); *H01M 2220/20* (2013.01); *H02J 2007/0039* (2013.01); *Y02T 10/7005* (2013.01); *Y02T 10/7061* (2013.01)

(56) References Cited

U.S. PATENT DOCUMENTS

| 9,118,094 B2* | 8/2015 | Tsujimura ........... H01M 2/1077 |
| 2005/0017682 A1 | 1/2005 | Canter et al. |
| 2010/0072950 A1 | 3/2010 | Tatebayashi et al. |

FOREIGN PATENT DOCUMENTS

| EP | 2 385 604 A1 | 11/2011 |
| WO | 93/10589 A1 | 5/1993 |

* cited by examiner

BATTERY MANAGEMENT SYSTEM HAVING AN INCREASED ROBUSTNESS AGAINST NEGATIVE VOLTAGES

This application is a 35 U.S.C. §371 National Stage Application of PCT/EP2013/062477, filed on Jun. 17, 2013, which claims the benefit of priority to Serial No. DE 10 2012 210 616.2, filed on Jun. 22, 2012 in Germany, the disclosures of which are incorporated herein by reference in their entirety.

The present disclosure relates to a battery management system having at least one cell monitoring unit which comprises a plurality of cell voltage connections, supply lines coupled to the cell voltage connections, and a cell monitoring circuit composed of a plurality of electronic semiconductor modules which are connected in parallel by means of the supply lines. In particular, the disclosure relates to such a battery management system which is provided to monitor a multiplicity of battery cells by means of the at least one cell monitoring unit, which battery cells are in each case connected on both sides by means of their respective positive battery cell terminal and their negative battery cell terminal via the cell voltage connections to the battery management system.

BACKGROUND

It is apparent that, in future, new battery systems will be increasingly used both in stationary applications, such as wind turbines, in vehicles, such as in hybrid and electric vehicles and in the consumer sector, such as in laptops and mobile telephones, with very stringent requirements being placed on said battery systems in respect of the reliability, safety, performance and service life thereof.

Batteries using lithium-ion technology are particularly suitable for such tasks. They are distinguished, inter alia, by high energy density and a low self-discharge. By definition, lithium-ion batteries consist of two or more lithium-ion cells which are mutually interconnected. Lithium-ion cells can be connected in parallel or in series to form modules and then interconnected to form batteries. In this case, a battery module usually consists of six or more cells.

In order to ensure reliable and correct functioning of a sufficiently long service life, lithium-ion cells may be connected to a battery management system, by means of which the battery is monitored and regulated. In this case, the battery management system performs a multiplicity of tasks, such as balancing, temperature regulating, etc. at the battery cells, which are necessary for the operation of the battery cells. In particular, the electrical voltage of the individual battery cells is also monitored, particularly so that no overloading or insufficient charging takes place.

The basic circuit diagram of a battery management system 100 of a traction battery is illustrated in FIG. 1. The architecture shown there consists of a so-called battery control unit 101 (BCU) and at least one or more so-called cell monitoring units 102 ("cell supervision circuits") (CSC) which are connected in situ via a communication bus 114 to the battery modules (not labeled). In this case, a cell monitoring unit 102 monitors the battery cells 103 of one or two battery modules, for example. The cell monitoring units 102 are present in a sufficient number to monitor the large number of—for example up to a hundred—battery cells 103 of a traction battery. Depending on which demands are placed on the performance of the battery system, the BCU and CSC electronics can be arranged on a common printed circuit board. As also shown in FIG. 1, the total voltage of the battery is tapped via a positive battery voltage supply line 104 and a negative battery voltage supply line 105 by the battery control unit in order to then be further processed in the battery control unit. Furthermore, the battery control unit 101, in addition to a charging contactor 106, also actuates a positive battery contactor 107 and a negative battery contactor 108, by means of which the positive battery cell terminal 109 and the negative battery cell terminal 110 can in each case be switched to be voltage-free. In particular, by actuation and subsequent opening of the contactors, a disconnection of the battery can be achieved in the event of an overcurrent or a short circuit, as a result of which a dangerous situation caused by the high battery voltage can be avoided in the event of an emergency. Current sensors 111, 112 are used to determine the battery current. Furthermore, the battery control unit 101 can be connected, for example by means of a CAN bus 113, to a central vehicle controller (not shown).

FIG. 2 is a basic illustration of an exemplary input circuit of a cell monitoring unit 200. As shown in FIG. 2, the cell monitoring unit 200 is constructed in a modular fashion and has a monitoring component denoted as companion chip 201 which controls the adherence to the permissible cell voltage range, and a so-called front-end chip or main chip 202 with which the cell voltages are measured. The front-end chip 202 comprises an analog-to-digital converter 203 and a control and communication unit 204 which can output and read data via daisy-chain connections 205, for example. Furthermore, the input circuit of the cell monitoring unit 200 has a filter 206 and a resistively operating balancing circuit 207. The companion chip 201 can be designed as a threshold voltage comparator and, when respective voltage limits are exceeded or undershot, it can output an alarm 208 and activate a hardware release cord, for example in order to open the contactors shown in FIG. 1. As shown in FIG. 2, the voltage limits in the case of lithium-ion cells can be 2.6 V or 4.2 V. The cell voltage is determined as an input voltage at the cell voltage connections 209.

A cell monitoring unit which has a companion chip is described, for example, in an earlier patent application by the applicant, with the application number DE 10 2011 079 120 A1.

What is disadvantageous in the known battery management systems is that monitoring which also includes negative input voltages, in particular when several battery cells to be monitored are present, would require additional high expenditure in terms of circuitry which would be connected to high costs. For this reason, the known battery management systems are often not configured to be sufficiently robust with respect to negative input voltages.

SUMMARY

According to the disclosure, a battery management system is provided, the battery management system having at least one cell monitoring unit which has a plurality of cell voltage connections, supply lines coupled to the cell voltage connections, and a cell monitoring circuit composed of a plurality of electronic semiconductor modules. In this case, the electronic semiconductor modules are connected in parallel by means of the supply lines arranged in the at least one cell monitoring unit. The battery management system is provided to monitor a multiplicity of battery cells by means of the at least one cell monitoring unit, which battery cells are in each case connected on both sides by means of their respective positive battery cell terminal and their negative battery cell terminal via the cell voltage connections to the battery management system. Furthermore, one or more of the supply lines is provided with a fuse, with the result that, in the case of each battery cell connected to the battery management system, at least one of the supply lines coupled to the battery cell has a fuse in the current path thereof.

One advantage of the disclosure is that increased robustness of the battery management system even in respect of negative input voltages at the cell voltage connections can be provided. In particular, what can be prevented is the destruction, owing to negative input voltages, of the integrated circuits or the electronic semiconductor modules which are arranged in the battery management system or in the cell voltage monitoring units. The background for the damage is that the semiconductor components are sensitive to negative voltages at their inputs and that, as a result of such negative voltages, very high inverse currents can flow through the components. In addition to destruction of the semiconductor components, such high inverse currents can also lead to the printed circuit board material of the cell voltage monitoring units catching fire, which in turn can lead to a vehicle fire. According to the disclosure, the battery management system is protected by the fuses arranged in the cell monitoring units in the event of negative input voltages. A possible expansion, related hereto, of the monitoring electronics in respect of negative voltages is superfluous.

According to an embodiment of the disclosure, the electronic semiconductor modules have a companion chip which controls the adherence to the permissible cell voltage range, and a main chip which is also referred to as front-end chip. The main chip may comprise an analog-to-digital converter and a control and communication unit. The cell voltages can be measured by means of the main chip.

The semiconductor components of the companion chip are protected according to the disclosure by the fuses which are provided in one or more of the supply lines. The solution according to the disclosure is not restricted to battery management systems such as this, which are only based on semiconductor components. Thus, the term "semiconductor module" within the context of this disclosure is used generally for a component which has semiconductor components or of which the functionality is mainly or largely based on phase conductor components, wherein components may also be present.

In the case of one advantageous embodiment of the disclosure, the supply lines form in each case either a positive branch or high side-path for making contact with a positive battery cell terminal or a negative branch or low side-path for making contact with a negative battery cell terminal, wherein the fuses used according to the disclosure are alternately placed in a positive branch or a negative branch of the supply lines on the basis of a sequence which is given by an arrangement of the cell voltage connections along a string composed of battery cells.

As a result, increased protection of the battery management system against negative currents or overcurrents flowing in the inverse direction can already be achieved in a particularly cost-effective manner. In this case, in comparison to the total number of cell voltage connections or supply lines, only half of the number of fuses according to the disclosure are used.

Thus, in the case of this embodiment, it is already possible to provide effective protection against overcurrent in the event of such occurrences in which a negative voltage is present such that an upper and a lower working point of the negative voltage are in each case connected via a fuse, wherein a cell voltage connection which is between the working points is only connected to a line without a fuse.

In this case, this embodiment is suitable for batteries in which, owing to the specific design of the battery and the battery cells, negative voltages occur only with a reduced probability between two such cell voltage connections, in which none of the supply lines is provided with a fuse according to the disclosure and in which a present negative voltage instead lies with increased probability chiefly between two such supply lines of which at least one is provided with a fuse according to the disclosure. In clear terms, the advantageous cost-effective embodiment is suitable, for example, for batteries in which a present negative voltage does not usually occur between two cell voltage connections or channels without fuses, with the result that a supply line having a fuse is situated merely in the middle of the two channels. In such a case, the negative input voltage would still be present across the two channels without fuses at the battery management system, even if the fuse had been tripped, and, correspondingly, can have negative effects.

Thus, the abovementioned embodiment can cover precisely such cases which occur with high probability in practice with half the potential expenditure.

According to another development of the disclosure, each of the supply lines is provided with a fuse. As a result, a comprehensive protection against negative voltages can be achieved.

In particular, the disclosure is also configured for such cell monitoring devices which have a filter and a balancing circuit which are connected to the supply lines of the cell monitoring electronics, more precisely in which the filter and the balancing circuit are connected in parallel with the rest of the electronic semiconductor modules according to the disclosure by means of the supply lines.

Furthermore, the disclosure is also advantageously able to be used in battery management systems in which so-called sensing lines are used for high-precision voltage detection.

Thus, according to an advantageous embodiment of the disclosure, at least one of the cell monitoring units is configured such that the supply lines of the at least one of the cell monitoring units are set up as sensing lines coupled to the corresponding assigned cell voltage connections. In this case, the electronic semiconductor modules of the at least one of the cell monitoring units have at least one balancing circuit, wherein the balancing circuit is directly coupled to the cell voltage connections. To be more precise, it is preferred that no further semiconductor modules are arranged between the balancing circuit and those cell voltage connections to which the balancing circuit connects. In other words, it is preferred that the remaining semiconductor modules, including a circuit for determining a cell voltage of that battery cell which is balanced using the balancing circuit, arranged downstream of the balancing circuit.

As a result, the length of the current path of a balancing current can expediently be kept to a minimum, with the result that there is almost no voltage drop caused by the balancing current, which voltage drop distorts a voltage measurement. Thus, this embodiment is particularly suitable for high-precision determination of cell voltages.

According to this embodiment, for example, the companion chip and a filter are connected such that they are located between the balancing circuit and the cell voltage determination circuit.

It is also particularly preferred that the fuse according to the disclosure or —if both a respective positive branch and a respective negative branch are provided with individual fuses —the respective two fuses are arranged in the supply lines, in this case the sensing lines, between the balancing circuit and the cell voltage determination circuit.

The cell voltage determination circuit can be implemented by the main chip or the front-end chip, which taps a present battery cell voltage at the cell voltage connections by means of the sensing lines. As has already been mentioned above, the balancing circuit is then preferably likewise connected to the sensing lines directly immediately downstream of the cell voltage connections.

According to a very advantageous development of the disclosure, the balancing circuit has a MOSFET switch, a balancing resistor and an intrinsic diode which is reverse-biased with respect to a normal battery cell voltage. As a result, although the fuse is not arranged upstream of the balancing circuit but merely downstream thereof, sufficient protection against negative current can be provided for the balancing circuit, even in the event that sensing lines are used.

According to an aspect of the disclosure, a battery having one or more battery modules is also provided, which battery also has the battery management system according to the disclosure. The battery comprises a multiplicity of battery cells which are arranged in one or more battery strings, wherein a battery string has a multiplicity of series-connected battery cells, with the result that a high output voltage can be generated, for example in order to drive a motor vehicle.

According to a development of the disclosure, the robustness of the battery is further increased by one or more of the series-connected battery cells having in each case an integrated cell fuse to protect the battery cells against overcurrent. The integrated cell fuse is configured such that the flow of current through the battery cell is interrupted in the event of an overcurrent. As a result, damage to the battery cells, for example in the event of a short circuit occurring, can be avoided.

At the same time, it can be ensured by means of the fuses arranged in the cell monitoring units that no damage is caused in the cell monitoring unit by such a disconnection of a battery cell from the battery string, although in such a case a high negative voltage arises at the corresponding cell voltage connections.

The battery according to the disclosure is preferably a lithium-ion battery.

Furthermore, according to the disclosure, a motor vehicle is provided having an electric motor which comprises the battery according to the disclosure, wherein the battery supplies the electric motor and is arranged in a drive train of the motor vehicle.

Advantageous developments of the disclosure are specified in the dependent claims and described in the description.

BRIEF DESCRIPTION OF THE DRAWINGS

Exemplary embodiments of the disclosure are explained in more detail below with reference to the drawings and the following description. In the drawings.

DETAILED DESCRIPTION

Battery cells for traction batteries are often embodied with integrated elements to increase safety. Such an element may be, for example, a fuse integrated in the battery cell. See in this respect FIG. 3, in which a battery cell 300 provided with an integrated fuse 301 ("current interruptive device") is shown, wherein the battery cell 300 shown there which can be monitored and regulated using the battery management system according to the disclosure (not shown in FIG. 3). If battery systems in which such battery cells 300 are used are operated at inadmissibly high currents, the fuse elements— in this case the integrated fuse 301—can trip the battery cells 300 in order to prevent damage to the battery cells 300. In this case, very high negative voltages may be present at the input terminals of the battery management system which are associated with the battery cells 300 in question, which negative voltages, depending on the amount, can be almost as high as the total battery voltage which, in the case of traction batteries, can be up to 400 V or more.

Figure 3:
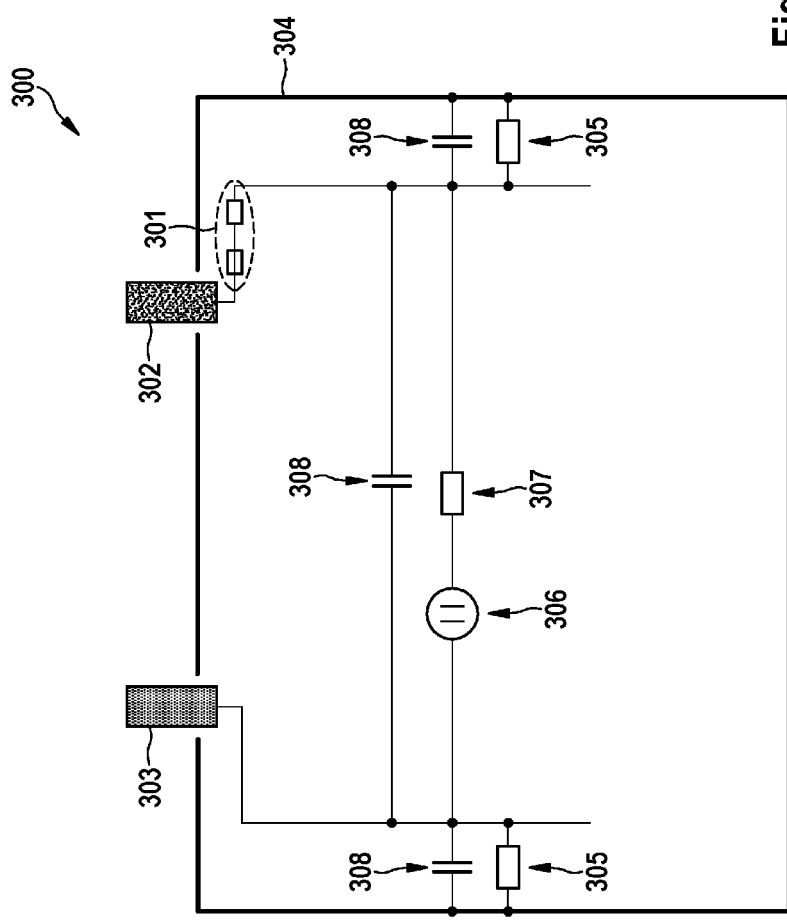
FIG. 3 shows a battery cell provided with an integrated fuse, which battery cell can be monitored and regulated by means of the battery management system according to the disclosure, according to an embodiment of the disclosure.

The housing 304 of the battery cell 300 is also shown in FIG. 3. A terminal electrical resistor, the value of which in practice depends on the particular form of the battery cell 300, exists in each case between the housing 304 and the battery cell terminal 302, 303. The battery cell 300 also has a particular internal resistance 307 and a no-load voltage 306 which is dependent on the type of cell and on the state of charge, which no-load voltage is usually kept in a range between 2.6 V and 4.2 V in the case of lithium-ion cells. According to the embodiment in FIG. 3, the integrated fuse 301 is connected to a positive battery cell terminal 302 and is provided to interrupt the current path of the battery cell 300. The capacitances 308 prevailing in the battery are also indicated in FIG. 3.

Figure 4:
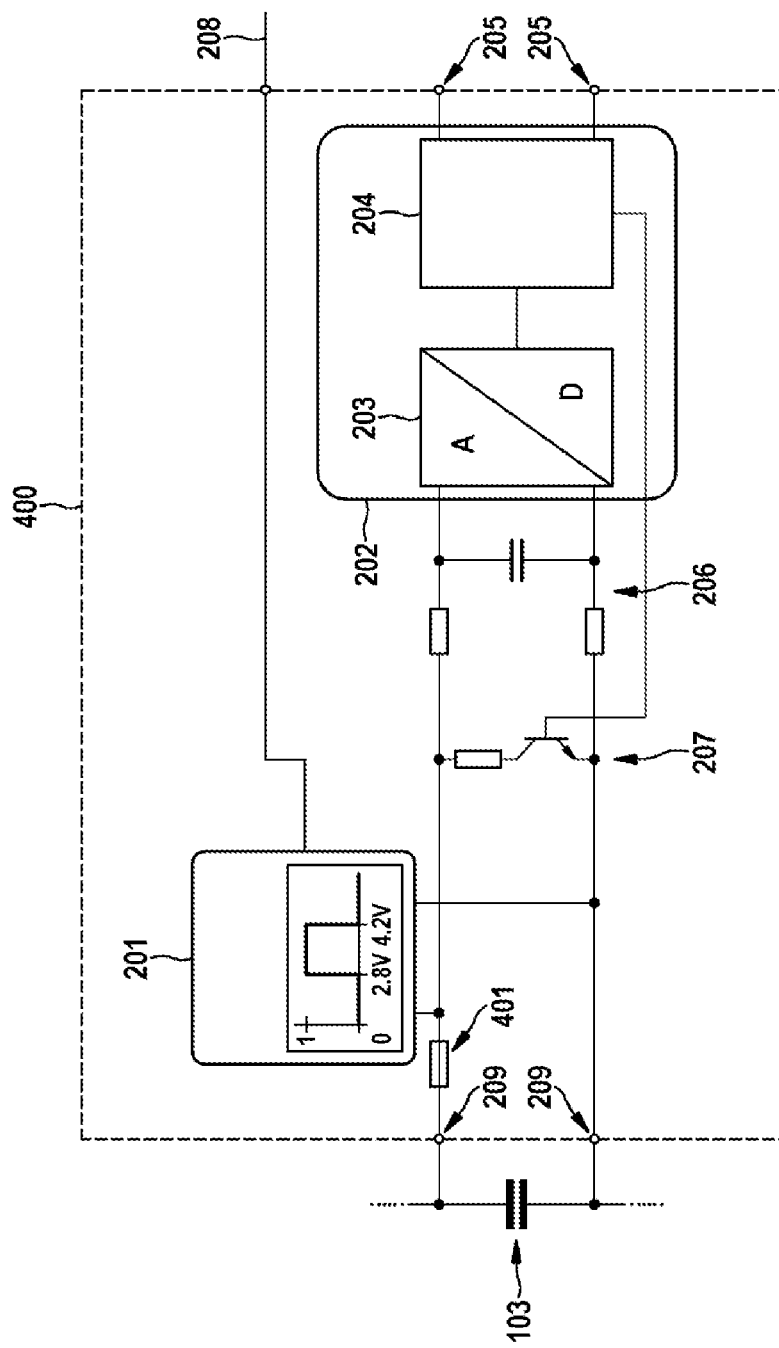
FIG. 4 shows an illustration of a cell monitoring unit according to the disclosure with increased robustness in respect of negative input voltages, wherein only one voltage detection channel is illustrated by way of representation, according to a first embodiment

FIG. 4 shows an illustration of a cell monitoring unit according to the disclosure with increased robustness in respect of negative input voltages according to one embodiment of the disclosure. For the sake of simplicity, only one voltage detection channel is shown in FIG. 4. However, the cell monitoring unit 400 generally has a multiplicity of voltage detection channels.

Figure 1:
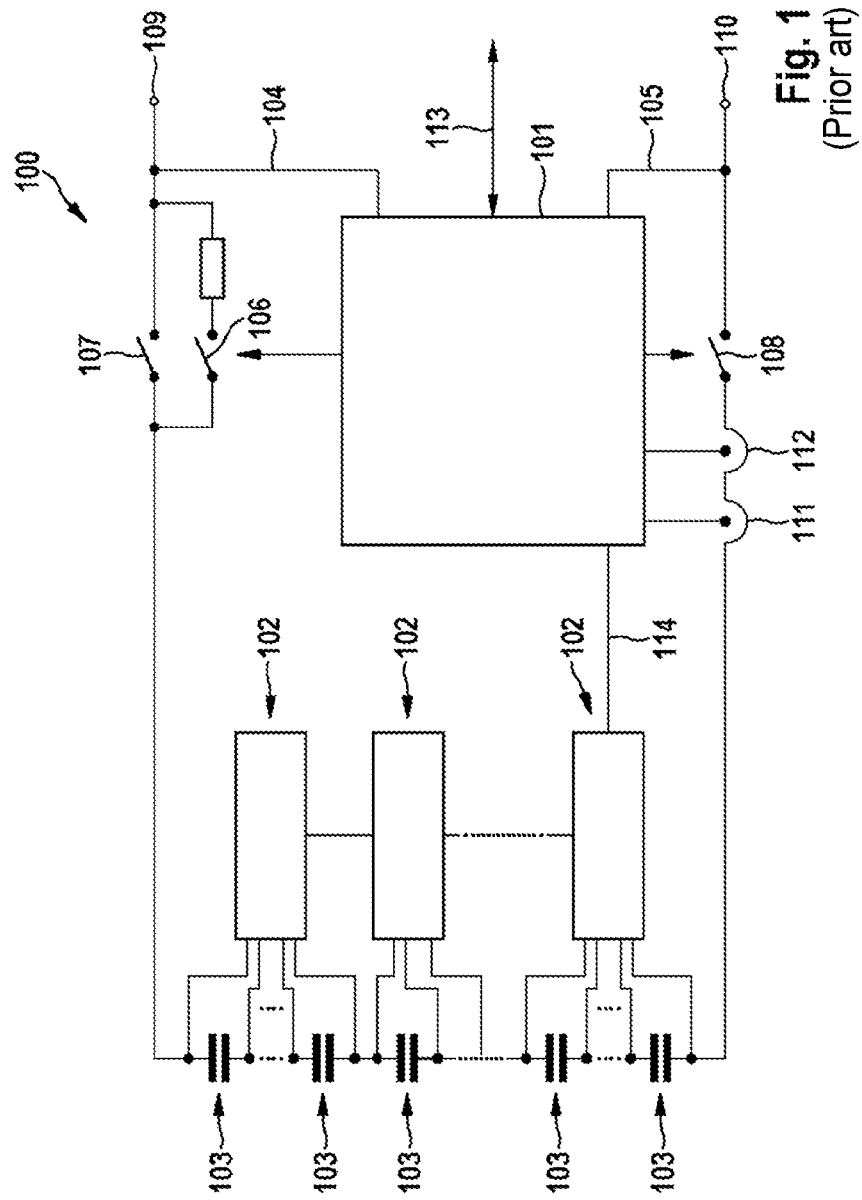
FIG. 1 shows a basic circuit diagram of a battery management system for traction batteries according to the prior art.
Figure 2:
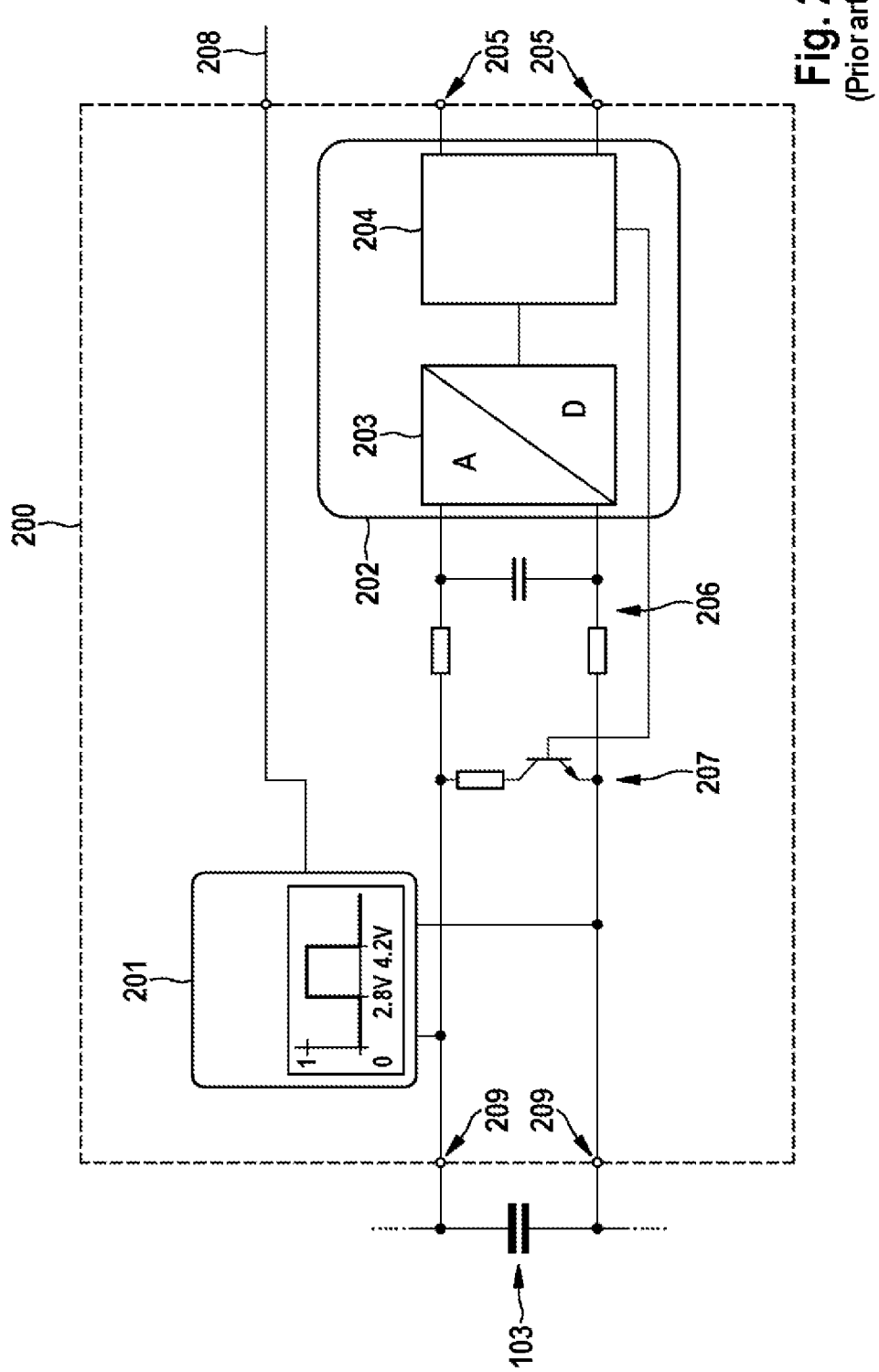
FIG. 2 shows a basic illustration of the input circuit of an exemplary cell monitoring unit according to the prior art.

The components shown in FIG. 4 which have already been explained above in connection with FIG. 2 are not discussed again here in order to avoid repetition. FIG. 4 shows how the cell monitoring electronics of the battery management system according to the disclosure can be protected against the effects of inadmissible negative voltages by means of a simple fuse 401. If negative input voltages occur at one or more inputs of the cell monitoring electronics, inadmissibly high inverse currents usually flow in the integrated circuits of the electronic components used for voltage detection and monitoring. As a result of this, the fuse 401 illustrated in FIG. 4 trips and prevents high currents from being able to heat the conductor tracks to such a degree that the board material catches fire. Thus, using the arrangement shown in FIG. 4, the robustness can be significantly increased, in particular in the case of an external short circuit—and even in the case of one internal to the battery—as may occur as a result of an accident with mechanical deformation of the battery or owing to other reasons.

Figure 5:
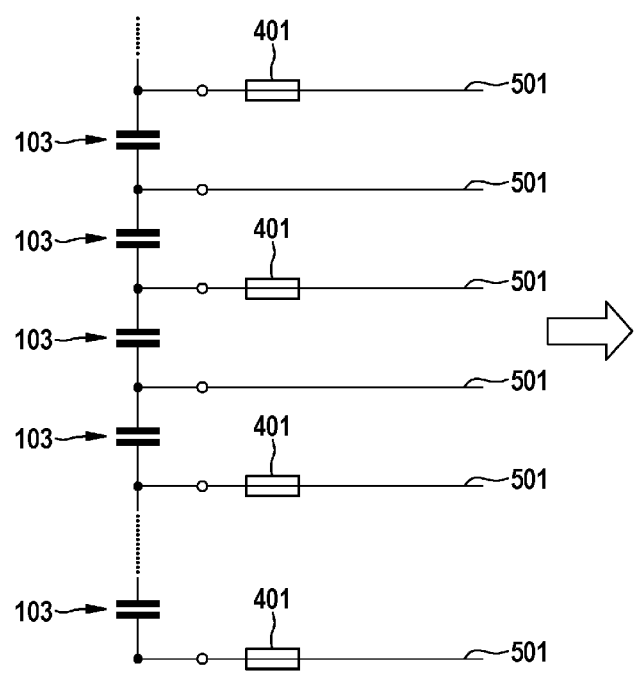
FIG. 5 shows an illustration of an arrangement of fuses for a plurality of voltage detection channels of a cell monitoring unit according to the disclosure with increased robustness in respect of negative input voltages, according to a second embodiment.

FIG. 5 shows by way of example a possibility for an arrangement of supply lines 501 and of fuses for a plurality of voltage detection channels of a cell monitoring unit according to the disclosure according to a second embodiment of the disclosure.

Figure 6:
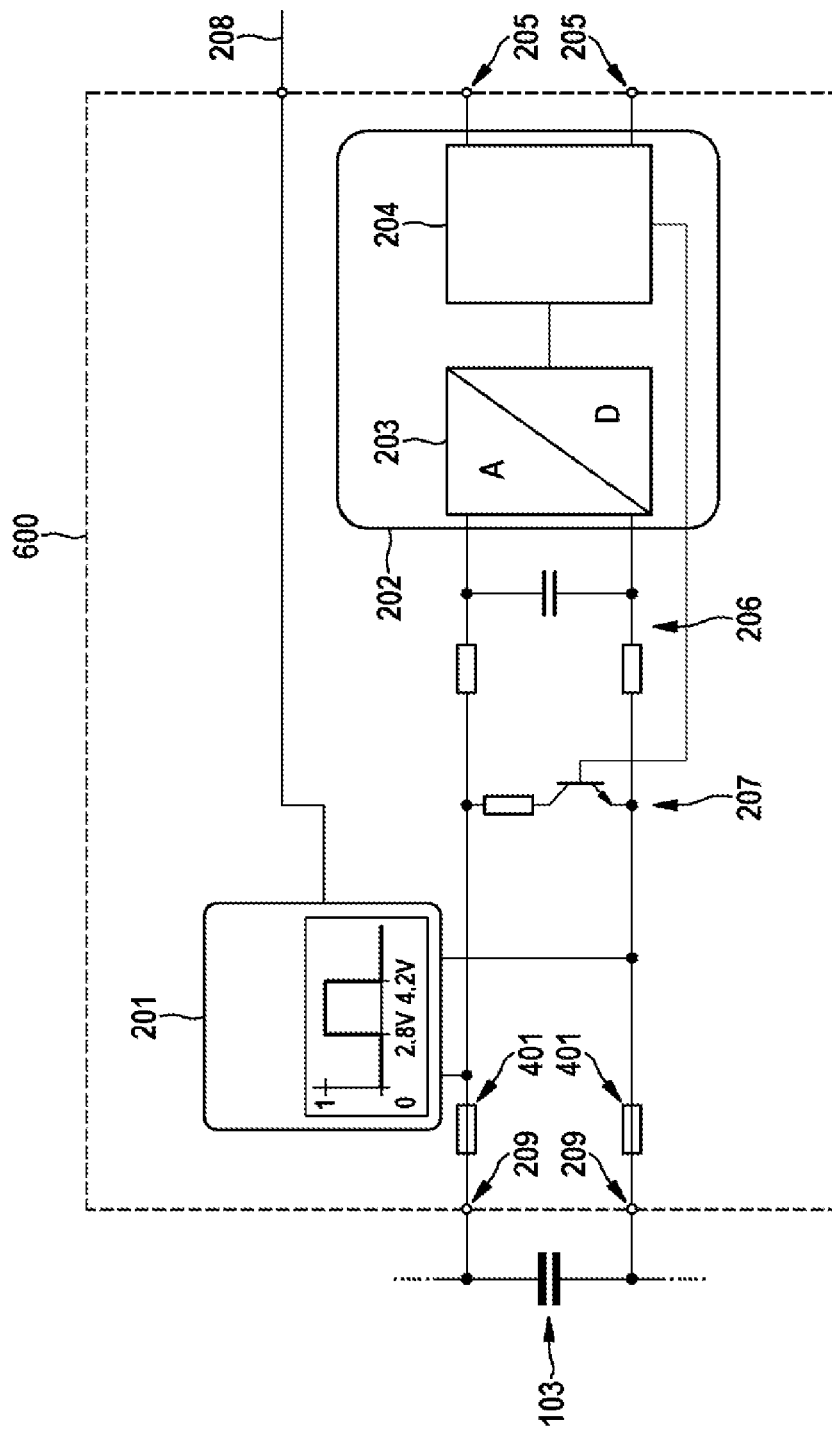
FIG. 6 shows a cell monitoring unit according to the disclosure with increased robustness in respect of negative input voltages, according to a third embodiment.

FIG. 6 shows a cell monitoring unit according to the disclosure with increased robustness in respect of negative input voltages according to a third embodiment of the disclosure.

In contrast to the cell monitoring unit 400 shown in FIG. 4, in the cell monitoring unit shown in FIG. 6, a fuse 401 is respectively arranged in both branches of the supply lines or of the voltage detection channel.

Owing to the solution according to FIG. 6, it is possible to realize, albeit with higher costs owing to twice as many fuses, very comprehensive protection for all possibilities of a negative electrical voltage to which the battery management system can be subject. Owing to the increased number of fuses 401 arranged in the supply lines, even cases in which a negative voltage appears via two channels of the battery management system arranged directly adjacent to one another can be safeguarded.

Figure 7:
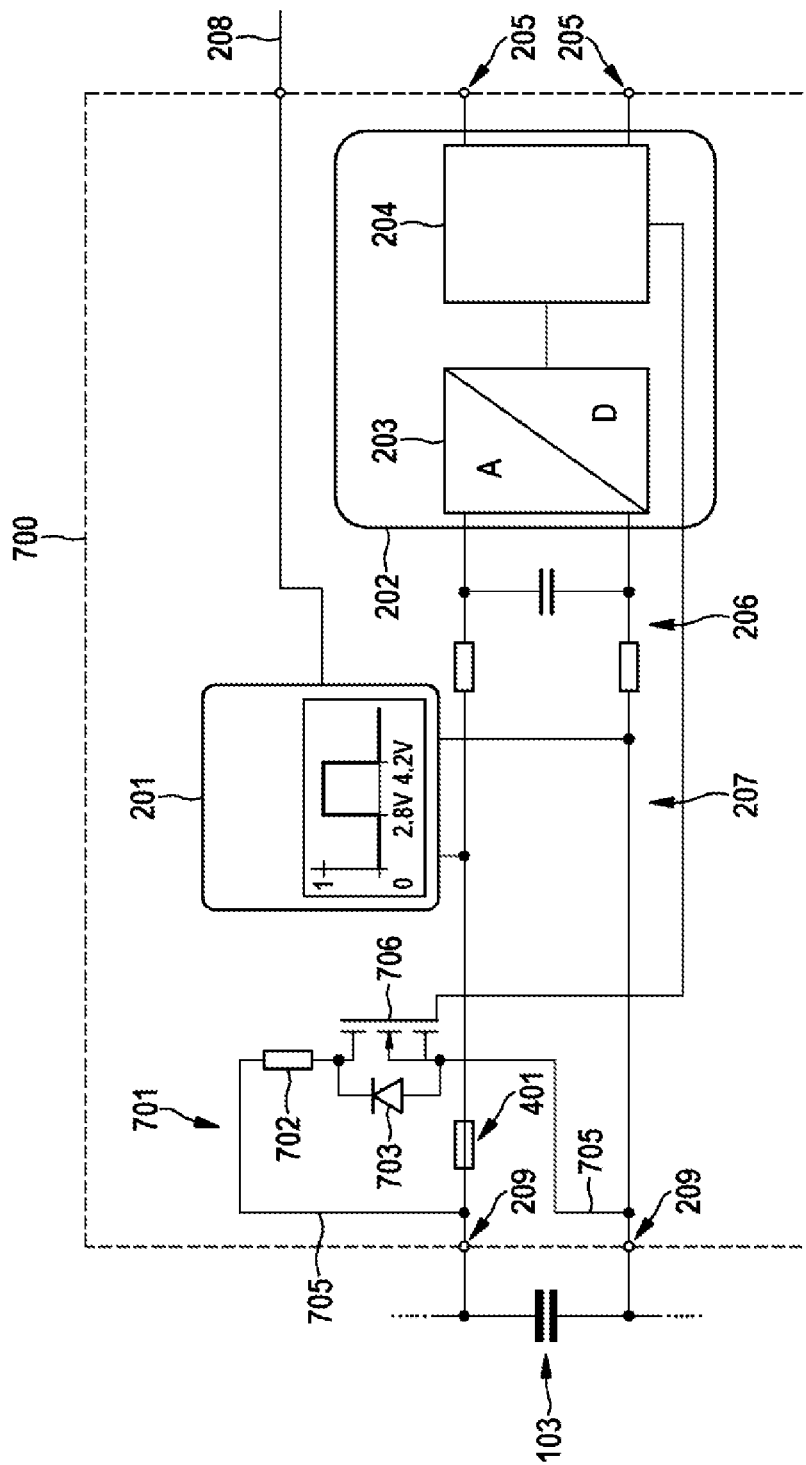
FIG. 7 shows a cell monitoring unit according to the disclosure with increased robustness in respect of negative input voltages, the cell monitoring unit having sensing lines, according to a fourth embodiment.

FIG. 7 shows a cell monitoring unit according to the disclosure having so-called sensing lines and with increased robustness in respect of negative input voltages according to a fourth embodiment of the disclosure.

According to FIG. 7, the fuse according to the disclosure is arranged downstream of the circuit part 701 for balancing the cells. In this case, the balancing circuit 701 can be protected by a suitable configuration of the components used for the cell balancing. The illustrated MOSFET switch 706 has an intrinsic diode 703 which is reverse-biased with respect to the normal cell voltage. If, as a result of a short circuit, a negative voltage is present at the input of the cell monitoring unit 700, the intrinsic diode 703 becomes conductive and a current which is limited via the balancing resistor 702 flows. In the case of suitable configuration of the balancing resistor 702, the current can be limited such that the printed circuit board material cannot catch fire.

In the case of the cell monitoring unit 700, the sensing lines 704 are set up for high-precision detection of the cell voltages. For this purpose, the circuit parts 701 used for balancing the cells are routed directly to the connections 209 on the printed circuit board with isolated signal lines, so that voltage drops as a result of the balancing currents do not lead to distortion of the voltage determination of the battery cells 103. The companion chip 201 is provided to additionally perform voltage monitoring in parallel with and independently of the voltage determination, in the case of which voltage monitoring it is checked here whether or not the cell voltages are within the voltage interval which is restricted for reasons of safety. According to the exemplary embodiment shown in FIG. 7, the companion chip 201 is likewise connected to the sensing lines 704 in parallel with the balancing circuit 701. However, the companion chip 201 could instead also be connected to the lines 705 via which the balancing of the battery cells 103 is performed. Then, however, additional safety measures would have to be taken to protect the companion chip 201 against negative voltages, which additional safety measures would be connected to additional expenditure in terms of circuitry.

The invention claimed is:

1. A battery management system comprising:
   at least one cell monitoring unit including a plurality of cell voltage connections, a plurality of supply lines electrically connected to the cell voltage connections and to a plurality of battery cells, at least one cell monitoring circuit including a plurality of electronic semiconductor modules electrically connected in parallel by the plurality of supply lines, and a plurality of fuses,
   wherein the battery management system is configured to monitor the plurality of battery cells with the at least one cell monitoring unit,
   wherein each battery cell of the plurality of battery cells includes a positive battery cell terminal and a negative battery cell terminal,
   wherein a corresponding supply line electrically connects each positive battery cell terminal and each negative battery cell terminal to a corresponding cell voltage connection, and
   wherein at least one of the corresponding supply lines for each battery cell includes a fuse of the plurality of fuses in a current path of a corresponding battery cell.

2. The battery management system as claimed in claim 1, wherein the plurality of electronic semiconductor modules comprise a companion chip configured to monitor an electric voltage of a monitored battery cell and a main chip including an analog-to-digital converter and a control and communication unit.

3. The battery management system as claimed in claim 1, wherein:
   the plurality of supply lines includes a plurality of positive supply lines configured to make contact with a corresponding one of the positive battery cell terminals and a plurality of negative supply lines configured to make contact with a corresponding one of the negative battery cell terminals, and
   the fuses of the plurality of fuses are alternately placed in the positive supply lines and the negative supply lines based on a sequence given by an arrangement of the plurality of cell voltage connections in a direction along a string composed of the battery cells.

4. The battery management system as claimed in claim 1, wherein each supply line of the plurality of supply lines includes a fuse of the plurality of fuses.

5. The battery management system as claimed in claim 1, wherein the at least one cell monitoring unit is configured such that the supply lines of the at least one of the cell monitoring unit are arranged as sensing lines coupled to corresponding assigned cell voltage connections and the electronic semiconductor modules of the at least one cell monitoring unit further have at least one balancing circuit directly coupled to the cell voltage connections such that remaining semiconductor modules are arranged downstream of the balancing circuit.

6. The battery management system as claimed in claim 5, wherein:
   the at least one balancing circuit has a MOSFET switch, a balancing resistor, and an intrinsic diode, and
   the intrinsic diode is reverse-biased with respect to a normal battery cell voltage.

7. A battery comprising:
   at least one battery module, each battery module including a plurality of battery cells electrically connected in series in a battery string; and a battery management system including at least one cell monitoring unit having a plurality of cell voltage connections, a plurality of supply lines electrically connected to the cell voltage connections and to the plurality of battery cells, and at least one cell monitoring circuit including a plurality of electronic semiconductor modules electrically connected in parallel by the plurality of supply lines, and a plurality of fuses, wherein the battery management system is configured to monitor the plurality of battery cells with the at least one cell monitoring unit, wherein each battery cell of the plurality of battery cells includes a positive battery cell terminal and a negative battery cell terminal, wherein a corresponding supply line electrically connects each positive battery cell terminal and each negative battery cell terminal to a corresponding cell voltage connection, and wherein at least one of the corresponding supply lines for each battery cell includes a fuse of the plurality of fuses in a current path of a corresponding battery cell.

8. The battery as claimed in claim 7, wherein at least one of the series-connected battery cells has an integrated cell fuse to protect the battery cells against overcurrent.

9. The battery as claimed in claim 7, wherein the battery cells are lithium-ion cells.

10. A motor vehicle comprising:
an electric motor; and
a battery arranged in a drive train of the motor vehicle and configured to supply the electric motor, the battery including (i) at least one battery module, each battery module including a plurality of battery cells electrically connected in series in a battery string, and (ii) a battery management system including at least one cell monitoring unit having a plurality of cell voltage connections, a plurality of supply lines electrically connected to the cell voltage connections and to the plurality of battery cells, at least one cell monitoring circuit including a plurality of electronic semiconductor modules connected in parallel by the plurality of supply lines, and a plurality of fuses, wherein the battery management system is configured to monitor the plurality of battery cells with the at least one cell monitoring unit, wherein each battery cell of the plurality of battery cells includes a positive battery cell terminal and a negative battery cell terminal, wherein a corresponding supply line electrically connects each positive battery cell terminal and each negative battery cell terminal to a corresponding cell voltage connection, and wherein at least one of the corresponding supply lines for each battery cell includes a fuse of the plurality of fuses in a current path of a corresponding battery cell.

\* \* \* \* \*